United States Patent
Kim et al.

(10) Patent No.: US 12,050,391 B2
(45) Date of Patent: Jul. 30, 2024

(54) DISPLAY DEVICE AND MOBILE TERMINAL INCLUDING THE SAME

(71) Applicant: LG Display Co., Ltd., Seoul (KR)

(72) Inventors: Hyun Seung Kim, Paju-si (KR); Jong Hyun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 142 days.

(21) Appl. No.: 17/863,764

(22) Filed: Jul. 13, 2022

(65) Prior Publication Data
US 2023/0176442 A1 Jun. 8, 2023

(30) Foreign Application Priority Data
Dec. 6, 2021 (KR) .................. 10-2021-0172699

(51) Int. Cl.
| | | |
|---|---|---|
| G02F 1/29 | (2006.01) | |
| G06V 40/16 | (2022.01) | |
| H04N 7/18 | (2006.01) | |
| H04N 23/55 | (2023.01) | |
| H10K 59/50 | (2023.01) | |

(52) U.S. Cl.
CPC .............. *G02F 1/29* (2013.01); *G06V 40/172* (2022.01); *H04N 7/183* (2013.01); *H04N 23/55* (2023.01); *H10K 59/50* (2023.02)

(58) Field of Classification Search
None
See application file for complete search history.

(56) References Cited

U.S. PATENT DOCUMENTS

| | | | | |
|---|---|---|---|---|
| 2008/0007486 | A1* | 1/2008 | Fujinawa | G02F 1/1347 345/5 |
| 2008/0259249 | A1* | 10/2008 | Chang | G02F 1/133615 349/65 |
| 2009/0016078 | A1* | 1/2009 | Murray | G02B 6/0063 445/24 |
| 2019/0005872 | A1* | 1/2019 | Newton | G02B 27/30 |

FOREIGN PATENT DOCUMENTS

KR 10-2018-0046985 A 5/2018

* cited by examiner

*Primary Examiner* — Ryan Crockett
(74) *Attorney, Agent, or Firm* — Birch, Stewart, Kolasch & Birch, LLP

(57) ABSTRACT

The present disclosure relates to a display device and a mobile terminal including the same. The display device can comprise a first display panel including a first pixel array region and a light transmissive region, and a second display panel disposed under the first display panel and including a second pixel array region overlapping the light transmissive region. The display device can further comprise a light guide module disposed between the light transmissive region of the first display panel and the second pixel array region of the second display panel to pass light from the second pixel array region to the light transmissive region. The light guide module can refract external light incident through the light transmissive region outside of the second pixel array region.

16 Claims, 10 Drawing Sheets

DISPLAY DEVICE AND MOBILE TERMINAL INCLUDING THE SAME

CROSS-REFERENCE TO RELATED APPLICATION

This application claims priority to Korean Patent Application No. 10-2021-0172699, filed in the Republic of Korea on Dec. 6, 2021, the disclosure of which is incorporated herein by reference in its entirety into the present application.

BACKGROUND

1. Field

The present disclosure relates to a display device and a mobile terminal including the same.

2. Discussion of the Related Art

An electroluminescent display device can be classified into an inorganic light emitting display device and an organic light emitting display device according to the material of a light emitting layer.

The organic light emitting display device of an active matrix type includes an organic light emitting diode (hereinafter referred to as OLED) that emits light by itself, and has an advantage in that the response speed is fast, the luminous efficiency and luminance are high, and viewing angle are large. In the organic light emitting display device, an OLED is formed in each pixel. The organic light emitting display device has a fast response speed, excellent luminous efficiency, luminance, and viewing angle, and has excellent contrast ratio and color reproducibility since it can express black gray scales in complete black.

On the other hand, multimedia capabilities of mobile terminals have been improved. For example, smart phones are embedded with a camera by default, and the resolution of cameras in the smart phones is increasing to the level of existing digital cameras. A front camera of the smart phone can restrict a screen design of the smart phone, which can make it difficult to design the screen. As such, in order to reduce a space occupied by the camera in the smart phone, a screen design including a notch or punch hole has been adopted in the smart phone, but the screen size can still be limited due to the camera, making it impossible or difficult to implement a full-screen display.

In order to implement the full-screen display in a mobile terminal (e.g., smart phone), pixels arranged at a low Pixels Per Inch (hereinafter referred to as PPI) can be arranged in a pixel region overlapping the camera under the display panel. However, although the transmittance of light can be increased in the pixel region of the low PPI, the image captured by the camera can be blurred due to pixels existing in the pixel region of the low PPI, and thus the image quality of the captured image can be deteriorated. Also the image quality compensation algorithm can improve the image quality deterioration, but the image quality deterioration due to pixel interference may not be completely eliminated.

SUMMARY OF THE DISCLOSURE

One object of the present disclosure is to solve or address the above-mentioned needs and/or problems.

Another object of the present disclosure is to provide a display device and a mobile terminal including the same, which address the limitations and disadvantages associated with the related art.

Accordingly, the present disclosure provides a display device and a mobile terminal including the same to implement a full-screen display and to improve the quality of an image captured by a camera.

The problems to be solved or addressed by the present disclosure are not limited to those mentioned above, and other problems not mentioned will be clearly understood by those skilled in the art from the following description.

A display device according to an embodiment of the present disclosure includes a first display panel including a first pixel array region and a light transmissive region; a second display panel disposed under the first display panel and including a second pixel array region overlapping the light transmissive region; and a light guide module which is arranged between a light transmissive region of the first display panel and a second pixel array region of the second display panel to pass light from the second pixel array region to the light transmissive region, and to refract external light incident through the light transmissive region away from the second pixel array region.

A display device according to another embodiment of the present disclosure includes a display panel including a first pixel array region, a light transmissive region, and a second pixel array region; and a light guide module disposed below the light transmissive region. A portion of the display panel in which the second pixel array region is disposed is folded behind the light guide module so that the second pixel array region faces the light guide module. The light guide module includes a switchable liquid crystal lens disposed between the light transmissive region and the second pixel array region and including a liquid crystal layer to which an electric field is applied according to a liquid crystal driving voltage.

A mobile terminal according to an embodiment of the present disclosure includes a display panel including a first pixel array region, a light transmissive region, and a second pixel array region; a light guide module disposed under the light transmissive region; an optical sensor module disposed at a position avoiding the light transmissive region and including one or more optical sensors into which external light refracted by the light guide module is incident; a display module configured to write pixel data of an input image to the first and second pixel arrays; and a host system that transmits photo data received from the optical sensor module to the display module. The light guide module passes the light from the second pixel array region toward the light transmissive region and refracts the external light incident through the light transmissive region toward the optical sensor module.

According to the present disclosure, since the optical sensor module is disposed in the screen on which the image is displayed, the full-screen display can be realized effectively.

The present disclosure can improve the quality of the captured image obtained from the optical sensor module because there are no pixels or circuit elements on the light path through which external light travels to the optical sensor module.

The present disclosure can minimize the interference of external light incident on the optical sensor module when a user creates a self-photographed picture or selfie image using a mobile terminal such as a smart phone, so that the selfie image quality can be improved.

The present disclosure can minimize noise in the output data of the optical sensor module when processing the user's biometric authentication, for example, the user's face authentication, by using the data received from the optical sensor module, so that the user authentication processing error can be prevented or minimized.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION OF THE EMBODIMENTS

Figure 1:
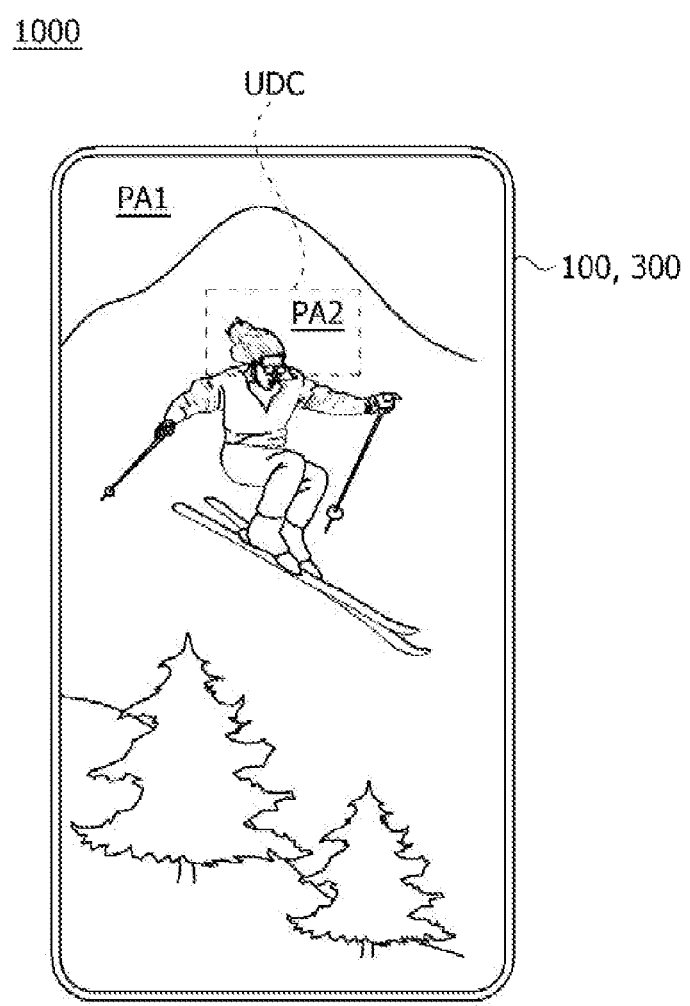
FIG. 1 is a view showing a screen of a mobile terminal according to an embodiment of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies can be omitted to avoid unnecessarily obscuring the subject matter of the present disclosure.

The terms such as "comprising," "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "below," and "next," one or more components can be positioned between the two components unless the terms are used with the term "immediately" or "directly."

The terms "first," "second," and the like can be used to distinguish components from each other, but the functions or structures of the components are not limited by ordinal numbers or component names in front of the components. These terms may not define order.

The same reference numerals can refer to substantially the same elements throughout the present disclosure.

The following embodiments can be partially or entirely bonded to or combined with each other and can be linked and operated in technically various ways. The embodiments can be carried out independently of or in association with each other.

Each of pixels in a display device can include a plurality of sub-pixels having different colors to in order to reproduce the color of the image on a screen of the display panel. Each of the sub-pixels preferably includes a transistor used as a switch element or a driving element. Such a transistor can be implemented as a TFT (Thin Film Transistor).

Hereinafter, various embodiments of the present disclosure will be described in detail with reference to the accompanying drawings. All the components of each display device and each mobile terminal including such display device according to all embodiments of the present disclosure are operatively coupled and configured.

Figure 2:
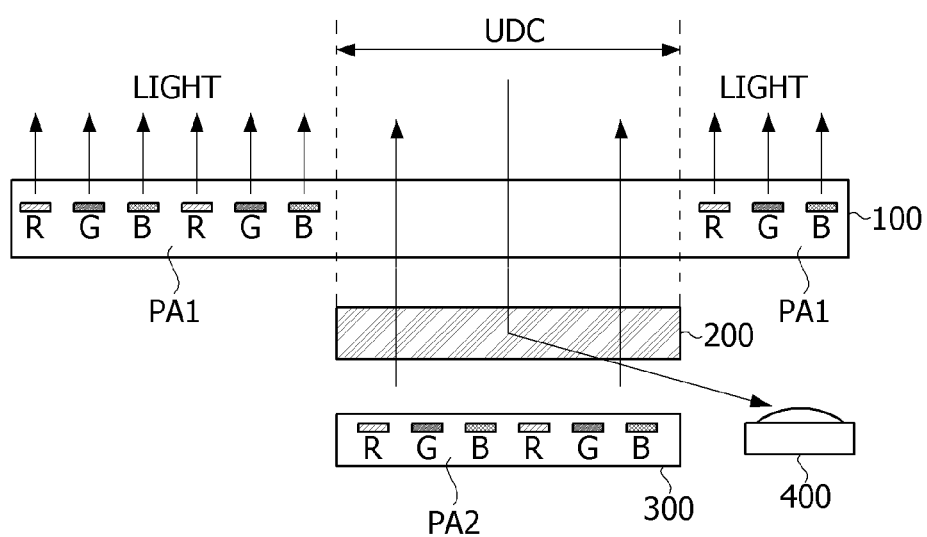
FIG. 2 is a cross-sectional view schematically illustrating a cross-sectional structure of a pixel array and a light transmissive region of a display panel according to an embodiment of the present disclosure.

Referring to FIGS. 1 and 2, a screen of a mobile terminal 1000 (e.g., smart phone or tablet) is implemented as display panels 100 and 300 of the display device. The display panels 100 and 300 include a first display panel 100, exposed to the outside, in which most of the input image is displayed, and a second display panel 300, disposed under the first display panel 100 and not exposed to the outside, in which a part of the input image is displayed.

The first display panel 100 and the second display panel 300 can be integrated or manufactured separately to be physically separated. Each of the display panels 100 and 300 can be implemented as a flexible display panel in which pixels are disposed on a flexible substrate such as a plastic substrate, but it is not limited thereto.

The pixel array regions PA1 and PA2 in the first and second display panels 100 and 300 include a plurality of data lines, gate lines crossing the data lines, and pixels connected to data lines and gate lines. Each of the pixels includes a light emitting element EL, a driving element for driving the light emitting element EL, one or more switch elements, and a capacitor for storing a gate-source voltage of the driving element. The pixel arrays PA1 and PA2 can be implemented as an active matrix pixel array in which each of the pixels includes a switch element. In another embodiment, the first pixel array region PA1 can be implemented as an active matrix pixel array, and the second pixel array region PA2 can be implemented as a passive matrix pixel array without a switch element.

The first display panel 100 includes a first pixel array region PA1 in which pixel data of an input image is written, and a light transmissive region UDC having no pixels. The light transmissive region UDC does not have the circuit layer 12 illustrated in FIGS. 3 and 4. The light transmissive region UDC can be disposed in the first pixel array region PA1.

The second display panel 300 includes at least a second pixel array region PA2 overlapping the light transmissive region UDC of the first display panel 100. The second pixel array region PA2 includes pixels to which some pixel data of the input image is written and displays a portion of the input image that cannot be reproduced in the light transmissive region UDC of the first display panel 100. Accordingly, the input image can be reproduced as a combination of the images displayed in the first pixel array region PA1 and the second pixel array region PA2.

In the light transmissive region UDC in the first display panel 100, there is no opaque material layer that does not block or interfere with light. Accordingly, light emitted from the pixels of the second display panel 300 can propagate to the outside through the light transmissive region UDC, and light from the outside can pass through the light transmissive region UDC and propagate down to the first display panel 100.

The display device includes the light guide module 200 disposed between the first display panel 100 and the second display panel 300, and an optical sensor module 400 disposed to avoid the light transmissive region UDC so as not to overlap the light transmissive region UDC.

The optical sensor module 400 can include one or more optical sensors such as an imaging module (or camera) including an image sensor, an infrared sensor module, and an illuminance sensor module and so on. The optical sensor module 400 can be disposed under the first display panel 100 to avoid the light transmissive region UDC, that is, not to overlap the light transmissive region UDC. The optical sensor module 400 does not overlap the second pixel array region PA2. The optical sensor module 400 can overlap the first pixel array region PA1, but it is not limited thereto. The optical sensor module 400 can be coplanar with the second display panel 300.

The light guide module 200 is disposed between the light transmissive region UDC of the first display panel 100 and the second pixel array region PA2 of the second display panel 300 to pass light from the second pixel array region PA2 through the light transmissive region UDC. On the other hand, the light guide module 200 refracts external light incident through the light transmissive region UDC of the first display panel 100 away from the second pixel array region PA2. External light refracted by the light guide module 200 can proceed to the optical sensor module 400 disposed to avoid the light transmissive region UDC. Accordingly, since there are no pixels or wires connected to the pixels on the optical path of the external light directed to the optical sensor module 400, external light can be incident on the optical sensor module 400 without interference.

Light emitted from the second pixel array region PA2 passes through the light guide module 200 as it is and propagates to the outside. When the user views the screen of the display device from the outside, he or she can see a completely reproduced image with little difference in quality between the image reproduced on the first display panel 100 and the image reproduced on the second display panel 300.

Figure 3:
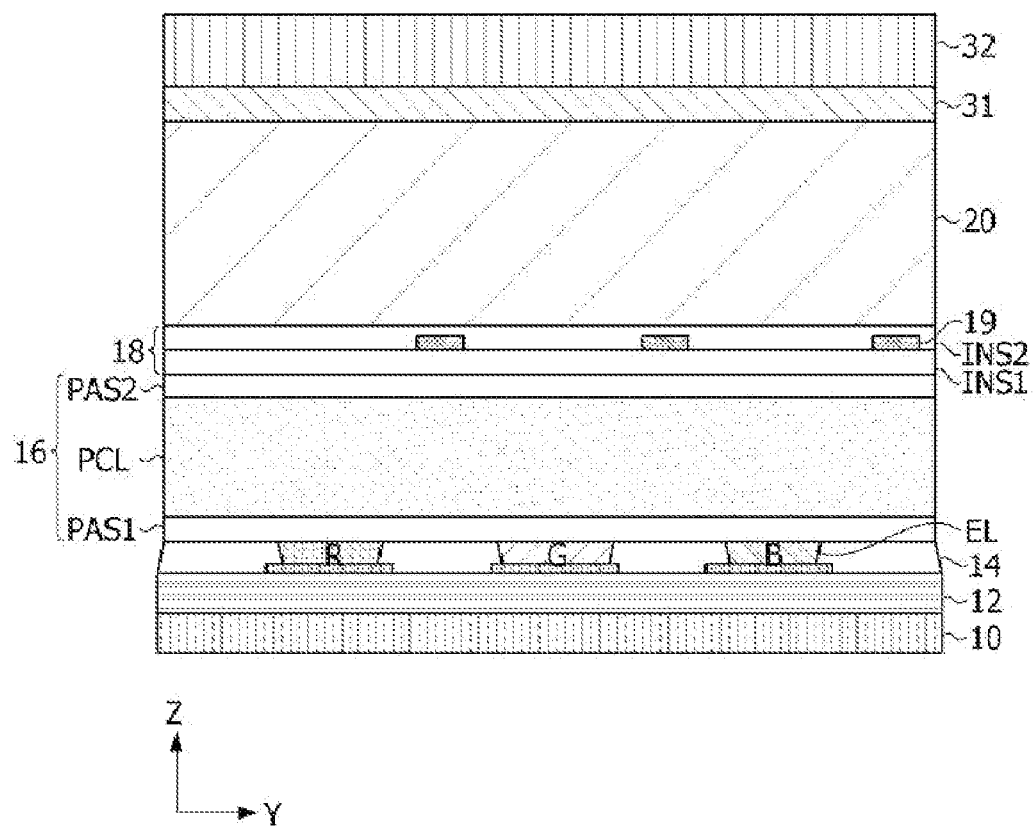
FIGS. 3 and 4 are cross-sectional views illustrating in detail a cross-sectional structure of a pixel array of a display panel according to various embodiments of the present disclosure.
Figure 4:
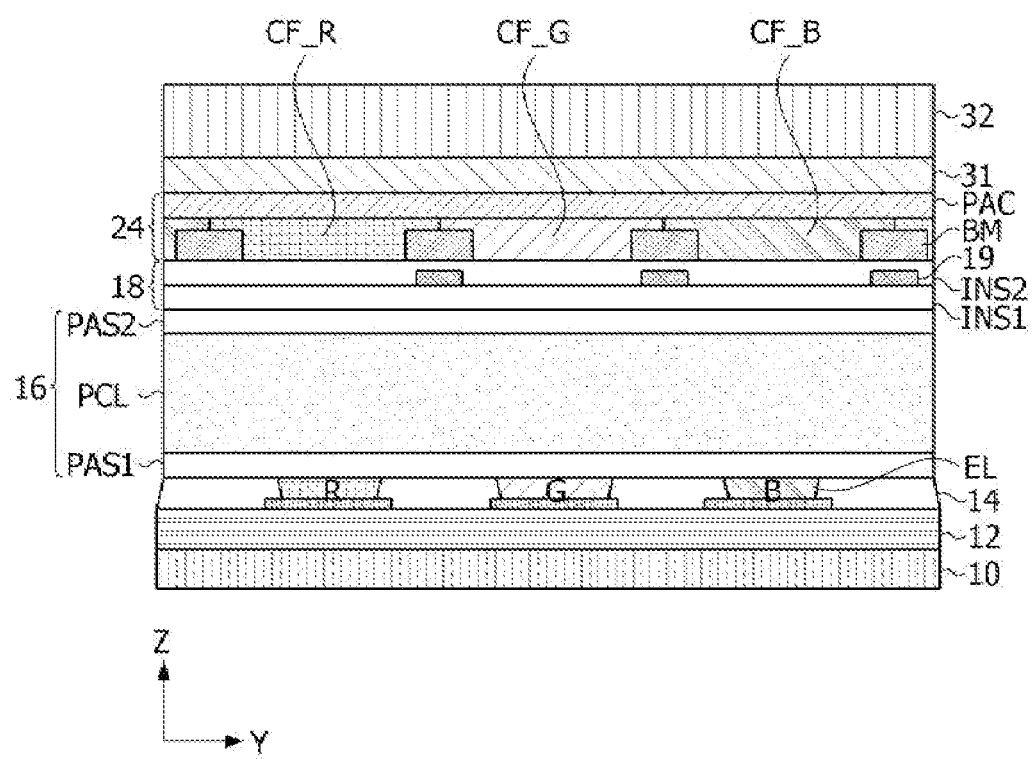

The cross-sectional structure of the pixel array of the first display panel 100 can include a circuit layer 12, a light emitting element layer 14, and an encapsulation layer 16 stacked on the substrate 10 as shown in FIGS. 3 and 4.

The circuit layer 12 can include a circuit necessary for driving a pixel, such as a pixel circuit connected to wires such as a data line, a gate line, and a power line. The wires and circuit elements of the circuit layer 12 can include a plurality of insulating layers, two or more metal layers separated with an insulating layer therebetween, and an active layer of a transistor including a semiconductor material.

The light emitting element layer 14 can include a light emitting element EL driven by the pixel circuit. The light emitting element (hereinafter referred to as EL) can include a red (R) light emitting element, a green (G) light emitting element, and a blue (B) light emitting element. In another embodiment, the light emitting element layer 14 can include a white light emitting element and a color filter. The light emitting elements ELs of the light emitting element layer 14 can be covered by a passivation layer including an organic film and a passivation film.

The encapsulation layer 16 covers the light emitting element layer 14 to seal the circuit layer 12 and the light emitting element layer 14. The encapsulation layer 16 can have a multi-insulating film structure in which an organic film PCL and an inorganic film PAS1 and PAS2 are alternately stacked. Inorganic films PAS1 and PAS2 block the penetration of moisture or oxygen. The organic film PCL planarizes the surfaces of the inorganic films PAS1 and PAS2. When the organic film PCL and the inorganic film PAS1 and PAS2 are stacked in multiple layers, the movement path of moisture or oxygen becomes longer than that of a single layer, effectively blocking the penetration of moisture and oxygen affecting the light emitting element layer 14.

The touch sensor layer 18 is formed on the encapsulation layer 16, and the polarizing plate 20 shown in FIG. 3 or the color filter layer 24 shown in FIG. 4 can be disposed thereon. The touch sensor layer 18 can include capacitive touch sensors that sense a touch input based on a change in capacitance before and after the touch input.

The touch sensor layer 18 can include metal wiring patterns 19 and insulating films INS1 and INS2 that form the capacitance of the touch sensors. The insulating films INIS1 and INS2 can insulate portions intersecting the metal wiring patterns 19 and can planarize the surface of the touch sensor layer.

The polarizing plate 20 converts the polarization of external light reflected by the metal of the touch sensor layer 18 and the circuit layer 12 to improve visibility and contrast ratio. The polarizing plate 20 can be implemented as a polarizing plate in which a linear polarizing plate and a phase delay film are bonded, or a circular polarizing plate. A cover glass can be adhered to the polarizing plate. The linear polarizing plate can be interpreted as a half wave plate (hereinafter referred to as HWP), and the circular polarizing plate can be interpreted as a quarter wave plate (hereinafter referred to as QWP).

An adhesive 31 is applied on the polarizing plate 20 so that a cover glass 32 can be adhered thereon. The adhesive 31 can be an optically transparent adhesive (hereinafter referred to as OCA).

The color filter layer 24 can include red, green, and blue color filters CF_R, CF_G, and CF_B. The color filter layer 24 can further include a black matrix pattern BM. The color filter layer 24 can absorb a portion of the wavelength of light reflected from the circuit layer 12 and the touch sensor layer 18 to replace the role of the polarizing plate 20, and can improve color purity of an image reproduced in the first pixel array region PA1. Accordingly, in the cross-sectional structure shown in FIG. 4, the polarizing plate 20 is not required.

The color filter layer 24 can include an organic film PAC covering the color filters CF_R, CF_G, and CF_B and the black matrix pattern BM and flattening the surface of the color filter layer 24. A cover glass 32 can be adhered to the organic film PAC of the color filter layer 24.

The cross-sectional structure of the pixel array of the second display panel 300 can be implemented to be the same as the cross-sectional structure of the pixel array of the first display panel 100 or can be implemented in a different structure. For example, at least one of the touch sensor layer 18, the polarizing plate 20, and the color filter layer 24 can be removed from the second display panel 300.

Figure 5:
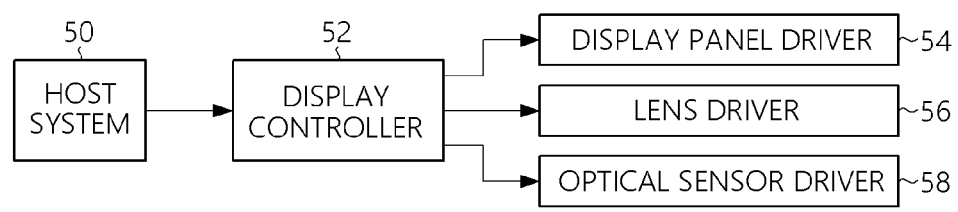
FIG. 5 is a block diagram showing the configuration of a driving unit of a mobile terminal according to an embodiment of the present disclosure.

FIG. 5 is a block diagram showing the configuration of a driving unit of a mobile terminal according to an embodiment of the present disclosure.

Referring to FIG. 5, a host system 50 of the mobile terminal can be connected to a power module, a sensor module, a communication module, a display module, and the like. The sensor module includes an optical sensor module 400. The host system 50 can include an application processor (hereinafter referred to as AP).

The host system 50 scales the input image to fit the resolution of the first and second pixel array regions PA1 and PA2 of the display panel and transmits the scaled input image to the display module.

The host system 50 can reproduce the photo image on the screen by transmitting the photo data received from the imaging module of the optical sensor module 400 to the display module. The host system 50 can determine the brightness of the usage environment of the mobile terminal 100 based on the data from the illuminance sensor of the optical sensor module 400 and can adjust the brightness of the image reproduced on the screen. The host system 50 can process the user's face authentication based on data received from the infrared sensor module of the optical sensor module 400.

The display module includes the display controller 52 and the display panel driver 54 to write the pixel data of the input image to the first and second pixel arrays PA1 and PA2. The display controller 52 transmits the pixel data of the input image received from the host system 50 to the display panel driver 54.

The display panel driver 54 includes a data driver that converts pixel data received from the display controller 52 into a gamma compensation voltage to output a data voltage, and a gate driver that outputs a gate signal such as a scan pulse. The data voltage of the pixel data is supplied to the data lines of the pixel array regions PA1 and PA2. The gate signal is supplied to the gate lines of the pixel array regions PA1 and PA2. The display panel driver 54 can further include a touch sensor driver. The display controller 52 can include a timing controller that controls the operation timing of the display panel driver 54.

The host system 50 or the display controller 52 can control the lens driver 56 and the optical sensor driver 58.

The lens driver 56 drives a switchable liquid crystal lens of the light guide module 200 under the control of the host system 50 or the display controller 52, to refract the external light toward the optical sensor module 400 while passing through drive light emitted from the pixels of the second display panel 300.

The optical sensor driver 58 drives each of the optical sensors of the optical sensor module 400 under the control of the host system 50 or the display controller 52 and transmits output data of the optical sensors to the host system 50.

Figure 6A:
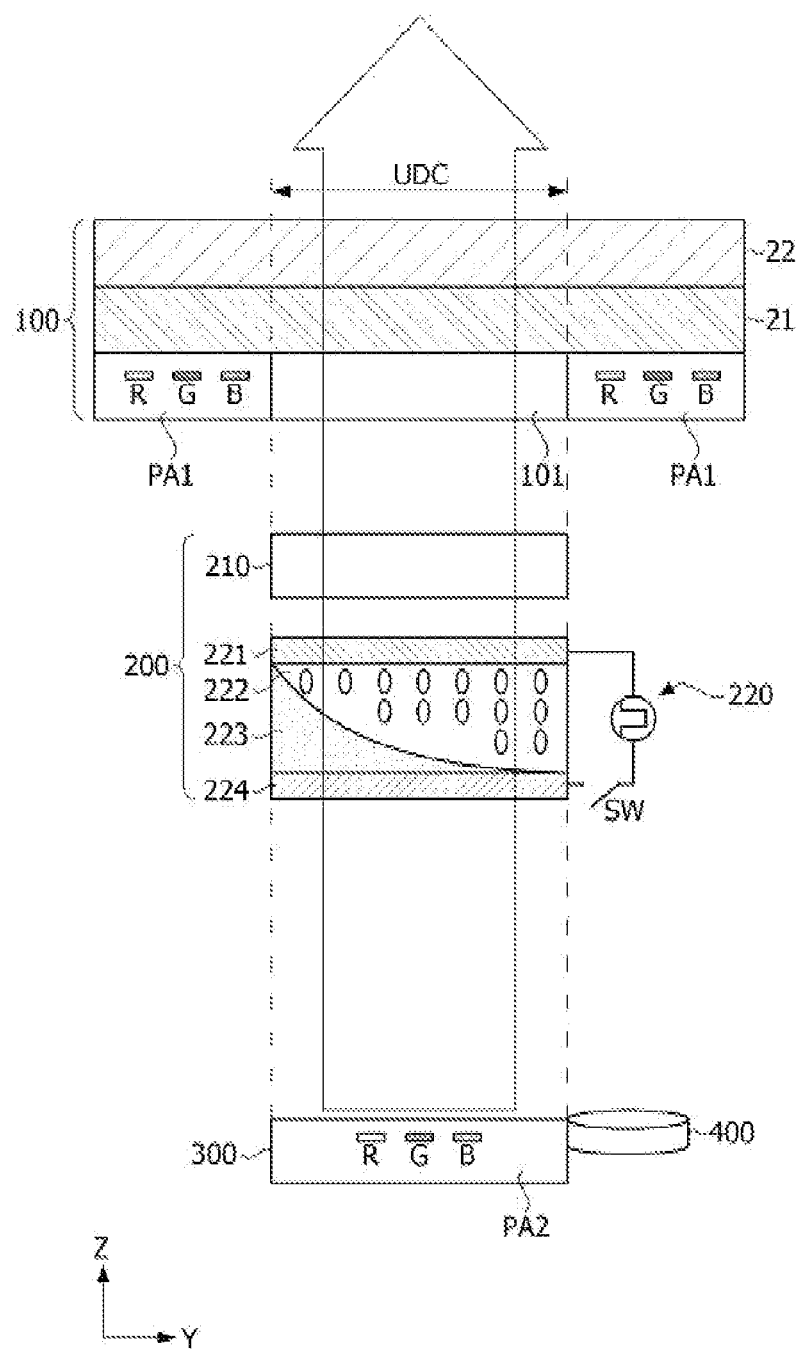
FIGS. 6A and 6B are cross-sectional views illustrating in detail structures of a display panel and a light guide module according to a first embodiment of the present disclosure.
Figure 6B:
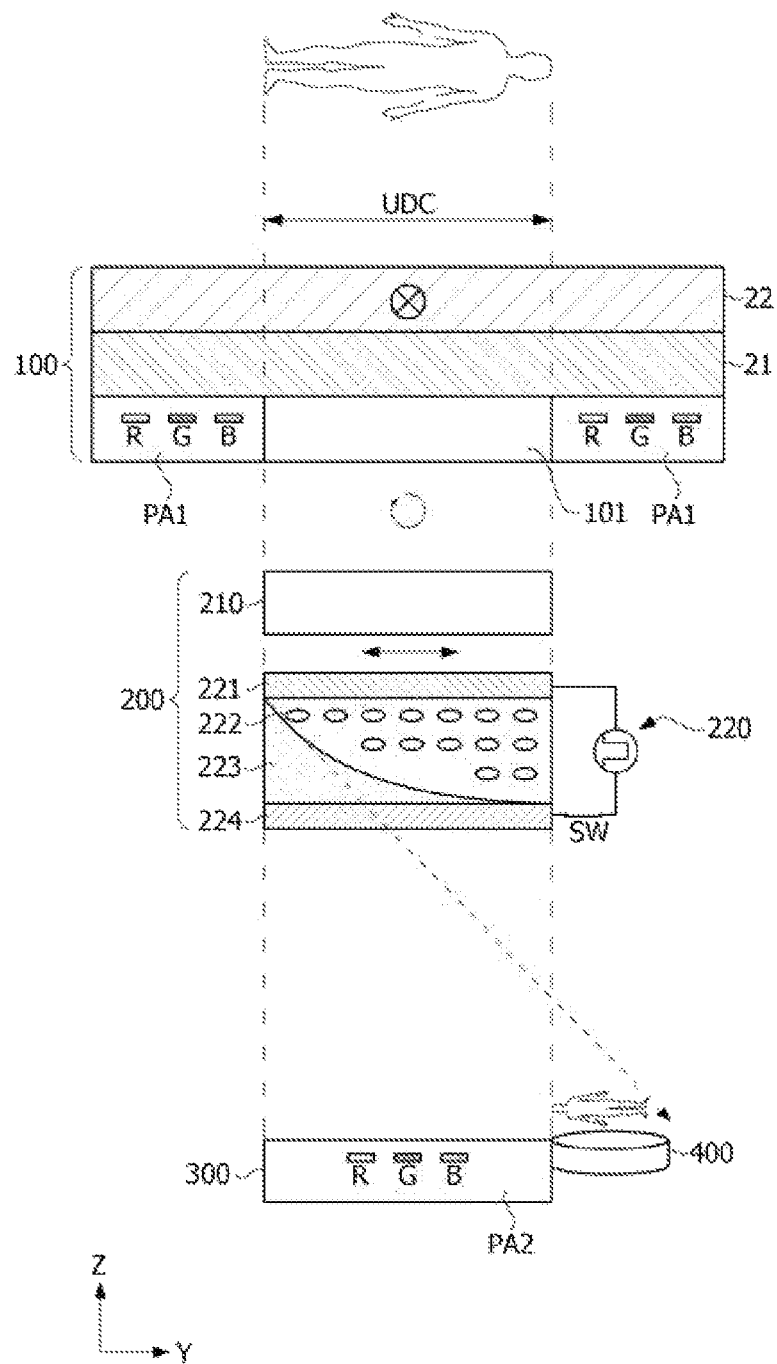

FIGS. 6A and 6B are cross-sectional views illustrating in detail the structures of the display panel and the light guide module according to the first embodiment of the present disclosure.

Referring to FIGS. 6A and 6B, the first display panel 100 includes the first pixel array region PA1, the linear polarizing plate 22, and the first circular polarizing plate 21.

The first pixel array region PA1 includes at least the circuit layer 12, the light emitting element layer 14, and the encapsulation layer 16 and displays most of the input image. The transparent portion 101 having no pixels and circuit elements is disposed in the light transmissive region UDC of the first display panel 100. The transparent part 101 is made of only a transparent insulating material, for example, an organic film and/or an inorganic film in the circuit layer 12 and the light emitting element layer 14.

The linear polarizing plate 22 and the first circular polarizing plate 21 can cover the display region in which the first pixel array region PA1 is disposed and the light transmissive region UDC. In the light transmissive region UDC, the first circular polarizing plate 21 can be disposed between the linear polarizing plate 22 and the transparent part 101. The linear polarizing plate 22 and the first circular polarizing plate 21 can be patterned to be disposed only in the light transmissive region UDC. The linear polarizing plate 22 passes the linearly polarized light traveling along a first optical axis, for example, a horizontal optical axis, from the incident light. The linear polarizing plate 22 can be a half-wave plate (HWP). The light passing through the first circular polarizing plate 21 is converted into circularly polarized light by delaying the phase of the linearly polarized light by 45 degrees.

The second display panel 300 overlaps the first display panel 100 with the light guide module 200 interposed therebetween. The second pixel array region PA2 overlaps the light transmissive region UDC to display an image in the light transmissive region UDC.

The light guide module 200 is disposed under the light transmissive region UDC of the first display panel 100. The optical guide module 200 can include a switchable liquid crystal lens 220, and a second circular polarizing plate 210 disposed between the switchable liquid crystal lens 220 and the first display panel 100.

The first and second circular polarizing plates 21 and 210 overlap with the transparent portion 101 of the first display panel 100 interposed therebetween. The second circular polarizing plate 210 delays the phase of the circularly polarized light incident from the first circular polarizing plate 21 by 45 degrees to convert it into linearly polarized light traveling along a second optical axis, for example, a vertical optical axis. The second circular polarizing plate 210 delays the phase of the linearly polarized light incident from the switchable liquid crystal lens 220 by 45 degrees to convert it into circularly polarized light.

The switchable liquid crystal lens 220 includes a first transparent electrode 221 formed on a first transparent substrate, a second transparent electrode 224 formed on a second transparent substrate, and a lens 223 and a liquid crystal layer 222 formed between the first transparent substrate and the second transparent substrate. An alignment film can be formed on at least one of the first and second transparent substrates. In another embodiment, when the first transparent electrode 221 and the second transparent electrode 224 are patterned along a specific alignment direction, for example, when patterned in a stripe shape, the alignment film can be omitted.

The first and second transparent electrodes 221 and 224 face each other with the liquid crystal layer 222 interposed therebetween to form an electric field in the liquid crystal layer 222 according to the liquid crystal driving voltage. The liquid crystal layer 222 can selectively refract incident light using the refractive index anisotropy of liquid crystal molecules to adjust the path of the light. The liquid crystal layer 222 can be implemented in a vertically aligned nematic liquid (hereinafter referred to as VA) mode or other liquid crystal mode. The first transparent electrode 221 and the second transparent electrode 224 of the switchable liquid crystal lens 220 can be formed of indium tin oxide (hereinafter referred to as ITO), but are not limited thereto.

The lens 223 can be formed of an insulating material having an appropriate refractive index in an organic or inorganic film formed on the circuit layer 12 and the light emitting element layer 14. The lens 223 refracts external light passing through the liquid crystal layer 222 due to a difference in refractive index with the liquid crystal layer 222.

In FIGS. 6A and 6B, 'SW' denotes a switch element for applying a liquid crystal driving voltage from the lens driver 56. In the display mode, the switch element SW is turned off, and in the optical sensor driving mode, the switch element SW is turned on to form an electric field in the liquid crystal layer 222. The refractive index of the switchable liquid crystal lens 220 can vary according to the liquid crystal driving voltage. Accordingly, it is possible to adjust the focal length and the image formation position (focus position) of the light refracted by the switchable liquid crystal lens 220 according to the liquid crystal driving voltage. In the optical sensor driving mode in which the switchable liquid crystal lens 220 is driven, the light refracted by the switchable liquid crystal lens 220 can proceed to the lens of the optical sensor module 400 located to avoid the light transmissive region UDC.

There is no potential difference between the first transparent electrode 221 and the second transparent electrode 224 when the switch element SW is turned off. In this case, the liquid crystal director of the liquid crystal layer 222 is in a horizontal direction.

The switch element SW is turned on so that a reference voltage is applied to any one of the first transparent electrode 221 and the second transparent electrode 224 and a liquid crystal driving voltage is applied to the other one. At that time, the liquid crystal molecules rotate by the potential difference between the first transparent electrode 221 and the second transparent electrode 224 so that the electric field direction between the first transparent electrode 221 and the second transparent electrode 224 and the long axis direction of the liquid crystal molecules are parallel. At that time, the liquid crystal director of the liquid crystal layer 222 changes in the vertical direction.

The lens 223 can be formed of a transparent organic material or an inorganic material. The thickness of the lens 223 decreases as the distance from the optical sensor module 400 decreases, and a lens surface is formed on the surface of the lens 223.

In the display mode, no electric field is applied to the switchable liquid crystal lens 220. In the display mode, there is no difference in refractive index between the liquid crystal layer 222 and the lens 223. Accordingly, in the display mode, as shown in FIG. 6A, light from the pixels of the second pixel array region PA2 passes through the switchable liquid crystal lens 220, the second circular polarizing plate 210, and the light transmissive region UDC of the first display panel (100) and proceeds to the outside.

An electric field is applied to the switchable liquid crystal lens 220 in the optical sensor driving mode. In the optical sensor driving mode, the liquid crystal director of the liquid crystal layer 222 can change so that the refractive index of the liquid crystal layer 222 can be greater than that of the lens 223. In the optical sensor mode, as shown in FIG. 6B, the linearly polarized light of the first optical axis passing through the linear polarizing plate 22 passes through the first circular polarizing plate 21 and is converted into circularly polarized light, and then passes through the second circular polarizing plate 210 and changes to the linearly polarized light of the second optical axis and proceeds to the switchable liquid crystal lens 220. External light incident on the switchable liquid crystal lens 220 proceeds to the optical sensor module 400 due to a difference in refractive index between the liquid crystal layer 222 and the lens 223. An inverted image of the external object can be formed on the optical sensor module 400. In the optical sensor driving mode, the optical sensor module 400 converts incident light into an electrical signal.

Circular polarizing plates 21 and 210 disposed between the linear polarizing plate 22 and the switchable liquid crystal lens 220 are disposed, but the present disclosure is not limited thereto. An n (n is a positive integer greater than or equal to 0)*λ/2 phase delay layer can be disposed between the linear polarizing plate 22 and the switchable liquid crystal lens 220. Here, λ is the wavelength of light. In the display mode, a circular polarizing plate (or λ/4 phase delay layer) can be disposed between the linear polarizing plate 22 and the switchable liquid crystal lens 220 in order to reduce the heterogeneity of images reproduced in the first pixel array area PA1 and the second pixel array area PA2.

Figure 7:
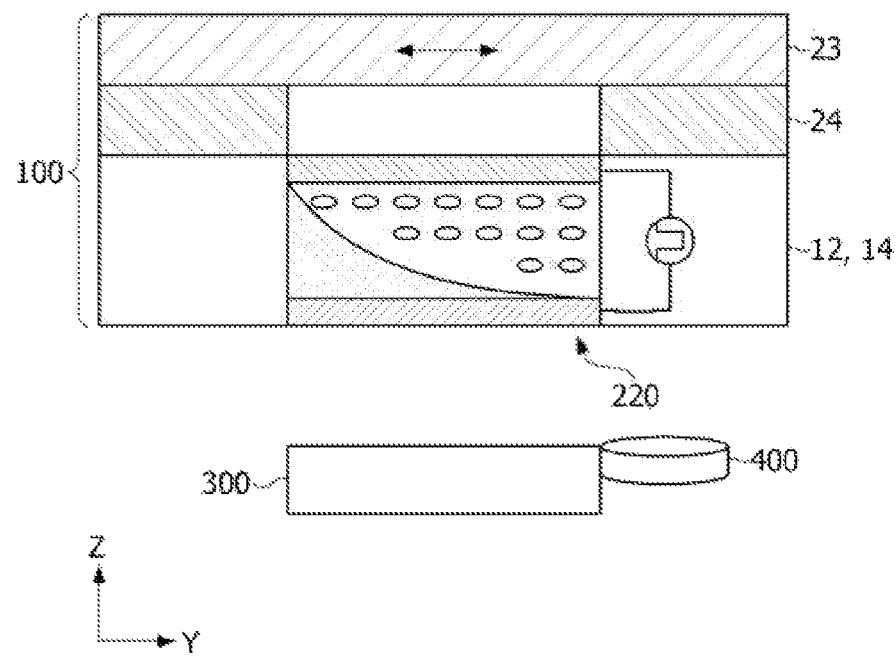
FIG. 7 is a cross-sectional view showing in detail structures of a display panel and a light guide module according to a second embodiment of the present disclosure.

FIG. 7 is a cross-sectional view showing in detail the structures of a display panel and a light guide module according to a second embodiment of the present disclosure.

Referring to FIG. 7, the first display panel 100 includes a first pixel array area PA1 in which a switchable liquid crystal lens 220 is embedded, a linear polarizing plate 23, and a circular polarizing plate 24.

The first pixel array region PA1 includes at least the circuit layer 12, the light emitting element layer 14, and the encapsulation layer 16, and displays most of the input image. The switchable liquid crystal lens 220 is disposed in the light transmissive region UDC of the first display panel 100 without a pixel.

The linear polarizing plate 23 can cover the display region in which the first pixel array region PA1 is disposed and the light transmissive region UDC. The linear polarizing plate 23 transmits the linearly polarized light traveling along the second optical axis, for example, the vertical optical axis, from the incident light. A phase delay layer of the circular polarizing plate 24 is disposed on the linear polarizing plate 23 and the first pixel array region PA1. The circular polarizing plate 24 can be patterned so that only the transparent portion exists in the light transmissive region UDC without the phase delay layer of the circular polarizing plate 24. The switchable liquid crystal lens 220 can overlap the linear polarizing plate 23 with a transparent portion having no phase delay layer between the switchable liquid crystal lens 220 and the linear polarizing plate 23.

The second display panel 300 is disposed under the first display panel 100 and at least partially overlaps the first display panel 100. The second pixel array region PA2 overlaps the light transmissive region UDC to display an image in the light transmissive region UDC. The switchable liquid crystal lens 220 is disposed in the light transmissive region UDC on the same layer as the first pixel array region PA1.

In the display mode, no electric field is applied to the switchable liquid crystal lens 220. In this case, since there is no difference in refractive index between the liquid crystal layer of the switchable liquid crystal lens 220 and the lens, light from the pixels of the second pixel array region PA2 is transmitted to the light transmissive region UDC of the first display panel 100 and proceeds to the outside.

In the optical sensor driving mode, an electric field is applied to the switchable liquid crystal lens 220. At this time, due to the difference in refractive index between the liquid crystal layer of the switchable liquid crystal lens 220 and the lens, the linearly polarized light of the second optical axis passing through the linear polarizing plate 23 is refracted in the switchable liquid crystal lens 220 to proceed the optical sensor module 400 arranged to avoid a light transmissive region UDC.

Figure 8:
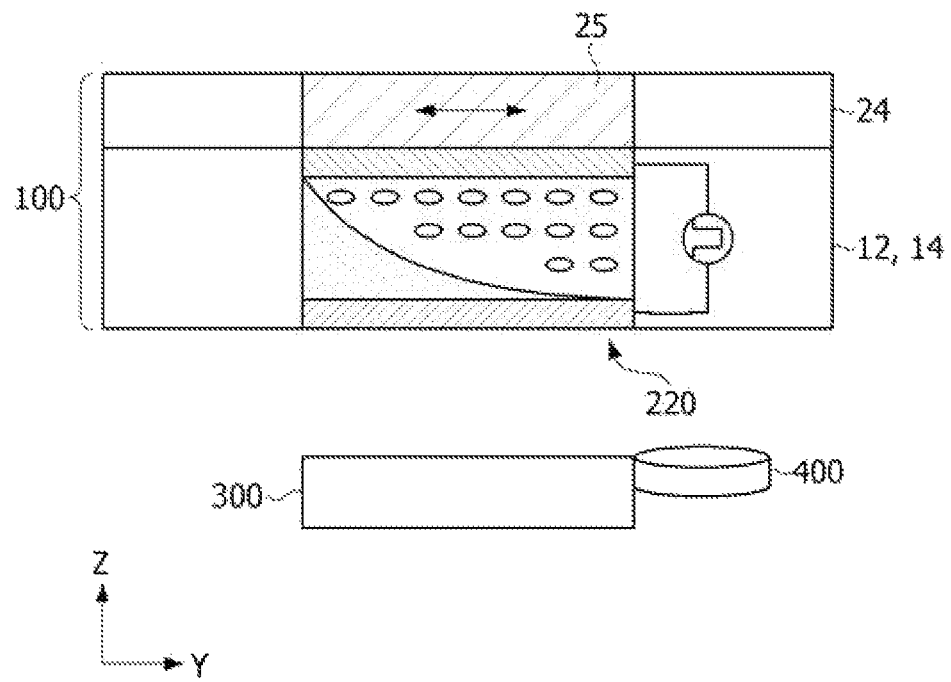
FIG. 8 is a cross-sectional view showing in detail a structure of a display panel and a light guide module according to a third embodiment of the present disclosure.

FIG. 8 is a cross-sectional view showing in detail the structures of a display panel and a light guide module according to a third embodiment of the present disclosure.

Referring to FIG. 8, the first display panel 100 includes a first pixel array region PA1 in which the switchable liquid crystal lens 220 is embedded, and a linear polarizing plate 25 disposed on the switchable liquid crystal lens 220 in a light transmissive region UDC.

The first pixel array region PA1 displays most of the input image including at least the circuit layer 12, the light emitting element layer 14, and the encapsulation layer 16. The switchable liquid crystal lens 220 is disposed in the light transmissive region UDC of the first display panel 100 without a pixel.

The phase delay layer of the linear polarizing plate 25 does not cover the first pixel array region PA1 and is disposed in the light transmissive region UDC. Accordingly, the linear polarizing plate 25 can be patterned to be disposed only in the light transmissive region UDC.

The second display panel 300 is disposed under the first display panel 100 and at least partially overlaps the first display panel 100. The second pixel array region PA2 overlaps the light transmissive region UDC to display an image in the light transmissive region UDC. The switchable liquid crystal lens 220 is disposed in the light transmissive region UDC on the same layer as the first pixel array region PA1.

In the display mode, no electric field is applied to the switchable liquid crystal lens 220. In this case, since there is no difference in refractive index between the liquid crystal layer of the switchable liquid crystal lens 220 and the lens, light from the pixels of the second pixel array region PA2 is transmitted to the light transmissive region UDC of the first display panel 100 and proceeds to the outside.

In the optical sensor driving mode, an electric field is applied to the switchable liquid crystal lens 220. At this time, due to the difference in refractive index between the liquid crystal layer of the switchable liquid crystal lens 220 and the lens, the linearly polarized light of the second optical axis passing through the linear polarizing plate 25 is refracted in the switchable liquid crystal lens 220 and proceeds to the optical sensor module 400 arranged to avoid a light transmissive region (UDC).

Figure 9:
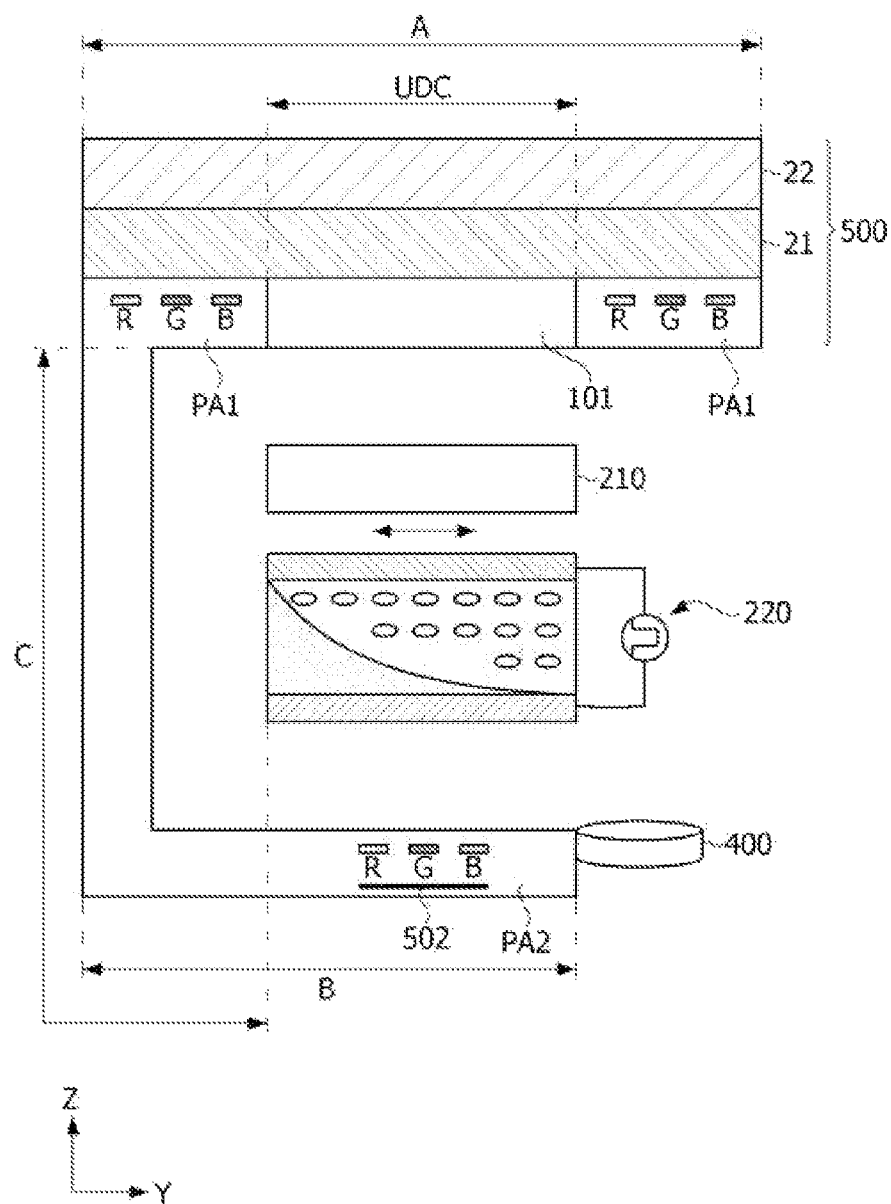
FIGS. 9 and 10 are cross-sectional views showing in detail structures of a display panel and a light guide module according to a fourth embodiment of the present disclosure.
Figure 10:
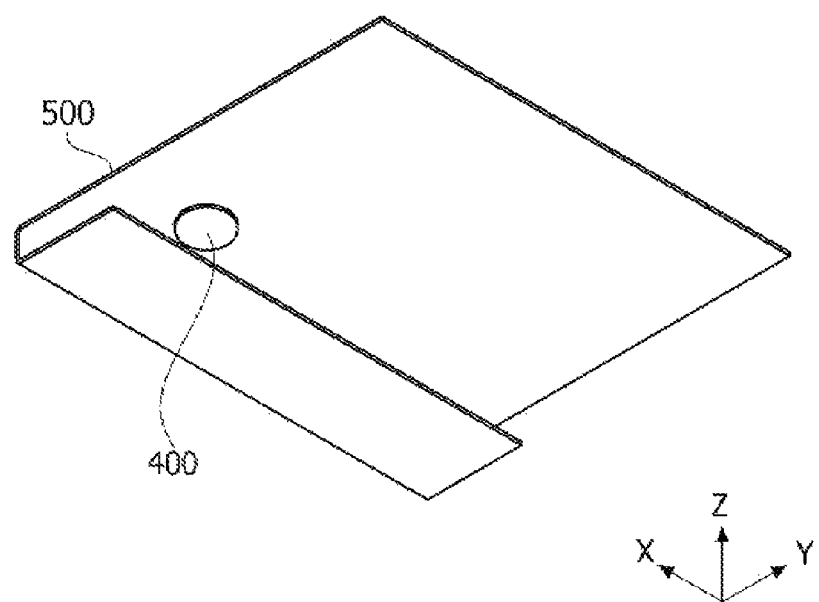

FIGS. 9 and 10 are cross-sectional views showing in detail the structures of the display panel and the light guide module according to the fourth embodiment of the present disclosure.

Referring to FIGS. 9 and 10, the display panel 500 is manufactured in a size larger than the screen of the mobile terminal 1000, and a part of the display panel is folded back. A second pixel array region PA2 is disposed on the rear portion B of the display panel 500 that is folded back.

A portion of the display panel 500 on which the second pixel array region PA2 is disposed is folded behind the light guide module 200 so that the second pixel array region PA2 faces the light guide module 200. Accordingly, in the display panel 500 the light guide module 200 and the second pixel array region PA2 overlap under the light transmissive region UDC having no pixels.

The display panel 500 has a front portion A on which the first pixel array region PA1 is disposed and a rear portion B on which a second pixel array region PA2 overlapped with the light transmissive region UDC is disposed.

The first and second pixel array regions PA1 and PA2 include a circuit layer 12 and a light emitting element layer 14. The light transmissive region UDC includes a transparent portion 101 made of only a transparent insulating material in the circuit layer 12 and the light emitting element layer 14.

The first pixel array region PA1 disposed on the front portion A of the display panel 500 includes at least the circuit layer 12, the light emitting element layer 14 and the encapsulation layer 16 and displays most of the image. The region C between the first pixel array region PA1 and the second pixel array region PA2 can be a blank region in which pixels are not required. Pixels may not be formed in this region C, but the present disclosure is not limited thereto. The second pixel array region PA2 disposed on the rear portion B of the display panel 500 overlaps the light transmissive region UDC and displays an image in the light transmissive region UDC.

The light guide module 200 is disposed between the front portion A and the rear portion B of the display panel 500. The switchable liquid crystal lens 220 of the light guide module 200 can be embedded in the front part A of the display panel 500 as shown in FIGS. 7 and 8, or as shown in FIG. 9, can be disposed in the space between the front portion A and the rear portion B of the display panel (500).

Since the display panel 500 is folded, when the pixels of the first pixel array region PA1 and the pixels of the second pixel array region PA2 are implemented in the same emission type, light can be directed in opposite directions. In consideration of this, the pixels of the first pixel array region PA1 can be implemented as a top emission type, and the pixels of the second pixel array region PA2 can be implemented as a bottom emission type.

In order to increase the efficiency of light emitted from the pixels of the second pixel array region PA2, a reflective layer 502 that reflects the light incident from the pixels on the second pixel array region PA2 to the light transmissive region UDC can be formed. The reflective layer 502 can be formed of a metal having high reflectivity in the circuit layer 12.

The optical sensor module 400 is disposed near the rear portion B of the display panel 500 to avoid the light transmissive region UDC. The optical sensor module 400 can overlap the first pixel array region PA1, but the present disclosure is not limited thereto.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a first display panel including a first pixel array region and a light transmissive region;
   a second display panel disposed under the first display panel and including a second pixel array region overlapping the light transmissive region; and
   a light guide module disposed between the light transmissive region of the first display panel and the second pixel array region of the second display panel to pass light from the second pixel array region to the light transmissive region, and configured to refract external light incident through the light transmissive region away from the second pixel array region.

2. The display device of claim 1, wherein the first pixel array region includes a circuit layer and a light emitting element layer, and
   the light transmissive region includes a transparent portion made of only a transparent insulating material in the circuit layer and the light emitting element layer.

3. The display device of claim 2, wherein the light guide module includes:
   a switchable liquid crystal lens including a liquid crystal layer disposed in the light transmissive region of the first display panel, and to which the electric field is applied according to a liquid crystal driving voltage;
   wherein the switchable liquid crystal lens further includes:
   first and second transparent electrodes facing each other with the liquid crystal layer interposed therebetween to form the electric field in the liquid crystal layer according to the liquid crystal driving voltage; and
   a lens configured to refract the light passing through the liquid crystal layer, and
   wherein a refractive index difference occurs between refractive indexes of the liquid crystal layer and the lens when the electric field is applied to the liquid crystal layer.

4. The display device of claim 3, further comprising:
   an optical sensor module disposed at a position avoiding the light transmissive region, and to which the external light refracted by the light guide module is incident,
   wherein a thickness of the lens decreases as a distance from the optical sensor module decreases.

5. The display device of claim 3, wherein the first display panel further includes:
   a linear polarizing plate stacked on at least the light transmissive region.

6. The display device of claim 5, wherein in the first display panel, the switchable liquid crystal lens overlaps the linear polarizing plate with a transparent portion having no phase delay layer between the switchable liquid crystal lens and the linear polarizing plate.

7. The display device of claim 1, further comprising:
   an optical sensor module disposed at a position avoiding the light transmissive region, and to which the external light refracted by the light guide module is incident.

8. The display device of claim 7, wherein the optical sensor module is substantially coplanar with the second display panel.

9. The display device of claim 7, wherein the light guide module includes:
   a switchable liquid crystal lens including a liquid crystal layer disposed between the light transmissive region of the first display panel and the second pixel array region of the second display panel, and to which an electric field is applied according to a liquid crystal driving voltage,
   wherein the switchable liquid crystal lens further includes:
   first and second transparent electrodes facing each other with the liquid crystal layer interposed therebetween to form an electric field in the liquid crystal layer according to the liquid crystal driving voltage; and
   a lens configured to refract the light passing through the liquid crystal layer, and
   wherein a refractive index difference occurs between refractive indexes of the liquid crystal layer and the lens when the electric field is applied to the liquid crystal layer.

10. The display device of claim 9, wherein a thickness of the lens decreases as a distance from the optical sensor module decreases.

11. The display device of claim 9, wherein the first display panel further includes:
    a linear polarizing plate and a first circular polarizing plate stacked on at least the light transmissive region.

12. The display device of claim 11, wherein the light guide module further includes:
    a second circular polarizing plate disposed between the switchable liquid crystal lens and the first circular polarizing plate, and
    wherein the first and second circular polarizing plates overlap with a transparent portion of the first display panel interposed between the first and second circular polarizing plates.

13. A mobile terminal comprising:
    a display panel including a first pixel array region, a light transmissive region, and a second pixel array region;
    a light guide module disposed under the light transmissive region;
    an optical sensor module disposed at a position avoiding the light transmissive region, and including one or more optical sensors to which an external light refracted by the light guide module is incident;
    a display module configured to write pixel data of an input image to the first and second pixel array regions; and
    a host system configured to transmit photo data received from the optical sensor module to the display module,
    wherein the light guide module passes light from the second pixel array region toward the light transmissive region and refracts the external light incident through the light transmissive region toward the optical sensor module.

14. The mobile terminal of claim 13, wherein the light guide module includes:

a switchable liquid crystal lens disposed between the light transmissive region and the second pixel array region, and including a liquid crystal layer to which an electric field is applied according to a liquid crystal driving voltage;

wherein the switchable liquid crystal lens further includes:

first and second transparent electrodes facing each other with the liquid crystal layer interposed therebetween to form an electric field in the liquid crystal layer according to the liquid crystal driving voltage; and a lens configured to refract the light passing through the liquid crystal layer, and wherein when an electric field is applied to the liquid crystal layer, a difference in refractive index between refractive indexes of the liquid crystal layer and the lens occurs.

15. The mobile terminal of claim 13, wherein the host system processes a user's face authentication based on the data received from the optical sensor module.

16. A display device comprising:

a first display panel including a first pixel array region and a light transmissive region, wherein a switchable liquid crystal lens is embedded in the first pixel array region, which overlaps with the light transmissive region; and a second display panel disposed under the first display panel and including a second pixel array region overlapping the light transmissive region, wherein the switchable liquid crystal lens passes light from the second pixel array region to the light transmissive region, and refracts external light incident through the light transmissive region away from the second pixel array region.

* * * * *